(12) United States Patent
Carroll

(10) Patent No.: US 9,245,714 B2
(45) Date of Patent: Jan. 26, 2016

(54) SYSTEM AND METHOD FOR COMPRESSED DATA TRANSMISSION IN A MASKLESS LITHOGRAPHY SYSTEM

(71) Applicant: KLA-Tencor Corporation, Milpitas, CA (US)

(72) Inventor: Allen M. Carroll, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/040,056

(22) Filed: Sep. 27, 2013

(65) Prior Publication Data

US 2014/0097362 A1 Apr. 10, 2014

Related U.S. Application Data

(60) Provisional application No. 61/708,163, filed on Oct. 1, 2012.

(51) Int. Cl.
| | |
|---|---|
| *H01J 37/317* | (2006.01) |
| *H01J 37/302* | (2006.01) |
| *G01F 23/284* | (2006.01) |
| *B82Y 10/00* | (2011.01) |
| *B82Y 40/00* | (2011.01) |

(52) U.S. Cl.
CPC .............. *H01J 37/3175* (2013.01); *B82Y 10/00* (2013.01); *B82Y 40/00* (2013.01); *G01F 23/284* (2013.01); *H01J 37/3023* (2013.01); *H01J 37/3177* (2013.01); *H01J 2237/31762* (2013.01); *H01J 2237/31789* (2013.01)

(58) Field of Classification Search
CPC ..................................................... H01J 37/317
USPC ....................................................... 250/492.22
See application file for complete search history.

(56) References Cited

U.S. PATENT DOCUMENTS

| | | | | |
|---|---|---|---|---|
| 5,825,419 A | * | 10/1998 | Mishima ................. | H04N 19/61 375/240.15 |
| 5,909,658 A | | 6/1999 | Charke et al. | |
| 6,453,073 B2 | * | 9/2002 | Johnson ................. | H04N 19/30 369/124.06 |
| 6,924,493 B1 | | 8/2005 | Leung | |
| 6,969,837 B2 | | 11/2005 | Ye et al. | |
| 7,189,498 B2 | | 3/2007 | Eib et al. | |
| 7,209,260 B1 | * | 4/2007 | Tanaka ....................... | G06T 1/60 358/1.16 |

(Continued)

OTHER PUBLICATIONS

Dai, "Data Compression for Maskless Lithography Systems: Architecture, Algorithms and Implementation", Dissertation, University of Californiua, Berkeley, 2008, pp. 1-165.*

(Continued)

*Primary Examiner* — Phillip A Johnston
(74) *Attorney, Agent, or Firm* — Suiter Swantz pc llo

(57) ABSTRACT

Compression, transmission and decompression of gray-tone imagery data includes receiving a gray-tone image suitable for printing at least a portion of a pattern onto a substrate by operation of an electron beam lithography system, aggregating sets of lines of the gray-tone image into trilines, sequentially encoding each of the trilines of the gray-tone image by operation of one or more encoders, the one or more encoders equipped with a codebook configured to store a plurality of triline fragments and a write location and transmitting the encoded trilines of the gray-tone image to a set of decoders of the digital pattern generator via a set of data pathways established between the one or more encoders and each of the decoders.

34 Claims, 9 Drawing Sheets

(56) References Cited

U.S. PATENT DOCUMENTS

| | | | |
|---|---|---|---|
| 7,618,751 | B2 | 11/2009 | Sandstrom et al. |
| 7,659,526 | B2 | 2/2010 | Zani et al. |
| 7,704,653 | B2 * | 4/2010 | Lordi .................... B82Y 10/00 430/22 |
| 7,791,710 | B2 | 9/2010 | Hoeks |
| 8,111,380 | B2 | 2/2012 | Abrams et al. |
| 8,259,289 | B2 | 9/2012 | Mulkens et al. |
| 8,326,051 | B1 * | 12/2012 | Hobbs ............................ 382/232 |
| 2003/0081846 | A1 * | 5/2003 | Whitehead ............... H04N 1/64 382/239 |
| 2005/0111745 | A1 * | 5/2005 | Kato .................. G06K 9/00442 382/243 |
| 2007/0030472 | A1 | 2/2007 | Hoeks |
| 2007/0045572 | A1 | 3/2007 | Kessels et al. |
| 2008/0145767 | A1 | 6/2008 | Lordi et al. |
| 2009/0073413 | A1 | 3/2009 | Abrams |
| 2010/0296141 | A1 * | 11/2010 | Maruyama ......... H04N 1/02865 358/509 |
| 2012/0286173 | A1 | 11/2012 | Van De Peut et al. |

OTHER PUBLICATIONS

Dai, "Data Compression for Maskless Lithography Systems: Architecture, Algorithms and Implementation", Dissertation, University of California, Berkeley, 2008, pp. 1-165.*

G. Cramer, H. Liu, A. Zakhor. "Lossless Compression Algorithm for REBL Direct-Write E-Beam Lithography System," Alternative Lithographic Technologies II, Proc. of SPIE 7637, pp. 1-15, Apr. 2, 2010.*

Vito Dai, Data Compression for Maskless Lithography Systems: Architecture, Algorithms and Implementation, Dissertation, Spring 2008, 165 pages, University of California, Berkeley, http://www-video.eecs.berkeley.edu/papers/vdai/phd-thesis.pdf.

Hsin-I Liu et al, Reduced Complexity Compression Algorithms for Direct-Write Maskless Lithography Systems, J. Micro/Nanolith., MEMS MOEMS 6(1), 013007 (Jan.-Mar. 2007), pp. 1-12.

Vito Dai et al., Full-Chip Characterization of Compression Algorithms for Direct-Write Maskless Lithography Systems, J. Micro/Nanolith. MEMS MOEMS 9(1), 013055 (Jan.-Mar. 2010), pp. 1-11.

G. Cramer, "Merging Lossless Compression Algorithms for the REBL Direct-Write E-Beam Lithography System," Master's Thesis, Department of Electrical Engineering and Computer Sciences, University of California, Berkeley, Feb. 2010, 50 pages.

T. Gubiotti et al., Reflective Electron Beam Lithography: Lithography Results Using CMOS Controlled Digital Pattern Generator Chip, Alternative Lithographic Technologies V, Proc. of SPIE, vol. 8680, © 2013 SPIE, p. 86800H-1-86800H-11.

* cited by examiner

SYSTEM AND METHOD FOR COMPRESSED DATA TRANSMISSION IN A MASKLESS LITHOGRAPHY SYSTEM

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled GRAY-SCALE RASTER DATA COMPRESSION FOR MASKLESS LITHOGRAPHY, naming Allen Carroll as inventor, filed Oct. 1, 2012, Application Ser. No. 61/708,163.

TECHNICAL FIELD

The present invention generally relates to compression, transmission and decompression of imagery data, and, in particular, to the compression, transmission and decompression of gray-tone imagery data in a reflective electron beam lithography system.

BACKGROUND

A lithographic process includes the patterned exposure of a resist allowing portions of the resist to be selectively removed, thereby exposing underlying areas for selective processing, such as etching, material deposition, ion implantation and the like. Typically, lithographic processes utilize ultraviolet light for selective exposure of the resist. In addition, charged particle beams (e.g., electron beams) have been used for high resolution lithographic resist exposure. The use of e-beam based lithography systems allows for relatively accurate control of the electron beam at relatively low power and relatively high speed.

Electron-beam lithography has typically been limited to applications which do not require high throughput due to practical limitations, such as limitations on beam current. The maskless reflective electron beam lithography system utilizes a unique patterning transducer which partially overcomes these limitations and enables higher total currents and potentially higher throughput than was available in prior systems. Due to the high system throughput there is now a need for a high rate of pattern data flow since geometric data must be communicated to the electron-beam tool's print head, which becomes problematic as throughput increases. An additional feature of reflective electron beam lithography (REBL) is that the patterning transducer is maintained at elevated electrical potential, requiring pattern data to be transmitted to it over fiber optic links.

In raster-style electron-beam lithography systems, pattern data transmission has usually not employed data compression, as a bit-stream, in the case of binary beam-blanking, or a byte-stream, in the case of gray-tone blanking, has been sufficient to supply pattern data at the needed rates. However, in the REBL system, each digital pattern device (DPG) may consume pattern data at rates up to ~0.5 terabyte/second, a high rate even by the standards of today's commercial telecommunications systems. Without data compression, REBL's data system would require a large number of optical fibers and fiber-optical components, making the packaging of these parts of the system ungainly and complex.

There are currently numerous general purpose compression methods. However, common methods involve decompression algorithms which are relatively complex, and as a result may not be suitable for 'on-chip' implementation in a system like REBL, whose patterning transducer (the dynamic pattern generator) consists of a CMOS chip in which numerous data streams must be simultaneously decompressed and which must therefore accommodate multiple copies of the de-compression circuit. Therefore, it is desirable to provide a method and system suitable for curing the defects of the prior art.

SUMMARY

A method for compressed data transmission in an electron beam lithography system is disclosed. In one aspect, the method includes, but is not limited to, receiving a gray-tone image suitable for printing at least a portion of a pattern onto a substrate by operation of an electron beam lithography system; aggregating sets of lines of the gray-tone image into trilines; sequentially encoding each of the trilines of the gray-tone image by operation of one or more encoders, the one or more encoders equipped with a codebook configured to store a plurality of triline fragments and a write location; and transmitting the encoded trilines of the gray-tone image to a set of decoders of the digital pattern generator via a set of data pathways established between the one or more encoders and each of the decoders.

In another aspect, the method includes, but is not limited to, receiving a gray-tone image suitable for printing at least a portion of a pattern onto a substrate by operation of an electron beam lithography system; aggregating sets of lines of each of a set of regions of the gray-tone image into trilines, each region of the gray-tone image corresponding with one of a set of segments of a digital pattern generator of the electron beam lithography system; sequentially encoding each of a set of trilines of each of the set of regions of the gray-tone image by operation of one or more encoders, the one or more encoders equipped with a codebook configured to store a plurality of triline fragments and a write location; and transmitting the encoded trilines of the set of regions of the gray-tone image to a set of decoders of the digital pattern generator, each of the set of decoders corresponding with one of the set of segments of the digital pattern generator, wherein the encoded trilines of a region are transmitted to a decoder of a segment corresponding with the region.

A system for compressed data transmission in an electron beam lithography system is disclosed. In one aspect, the system includes, but is not limited to, an image source configured to store one or more gray-tone images suitable for printing at least a portion of a pattern onto a substrate by operation of an electron beam lithography system; and a data compression system including: one or more triline aggregators configured to: receive a gray-tone image from the image source; and aggregate a sets of lines of each of a set of regions of the gray-tone image into trilines, each region of the gray-tone image corresponding with one of a set of segments of a digital pattern generator of the electron beam lithography system; and one or more encoders configured to: sequentially encode each of a set of trilines of each of the set of regions of the gray-tone image, the one or more encoders equipped with a codebook configured to store a plurality of triline fragments and a write location; and transmit the encoded trilines of the set of regions of the gray-tone image to a set of decoders of the digital pattern generator via a set of data pathways, each of the set of decoders corresponding with one of the set of segments of the digital pattern generator, wherein the encoded trilines of a region are transmitted to a decoder of a segment corresponding with the region.

A system for electron beam lithography with data compression and transmission capabilities is disclosed. In one aspect, the system includes, but is not limited to, an electron beam lithography optical sub-system including: an electron source; a set of illumination optics; a digital pattern generator; a set of projection optics configured to project electrons reflected from the digital pattern generator onto one or more portions of one or more substrates disposed on a substrate stage; an image source configured to store one or more gray-tone images suitable for printing at least a portion of a pattern onto a substrate by operation of the electron beam lithography optical sub-system; and a data compression system including: one or more triline aggregators configured to receive a gray-tone image from the image source; and aggregate a sets of lines of each of a set of regions of the gray-tone image into trilines, each region of the gray-tone image corresponding with one of a set of segments of the digital pattern generator of the electron beam optical sub-system system; and one or more encoders configured to sequentially encode each of a set of trilines of each of the set of regions of the gray-tone image, the one or more encoders equipped with a codebook configured to store a plurality of triline fragments and a write location; and transmit the encoded trilines of the set of regions of the gray-tone image to a set of decoders of the digital pattern generator via a set of data pathways, each of the set of decoders corresponding with one of the set of segments of the digital pattern generator, wherein the encoded trilines of a region are transmitted to a decoder of a segment corresponding with the region.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
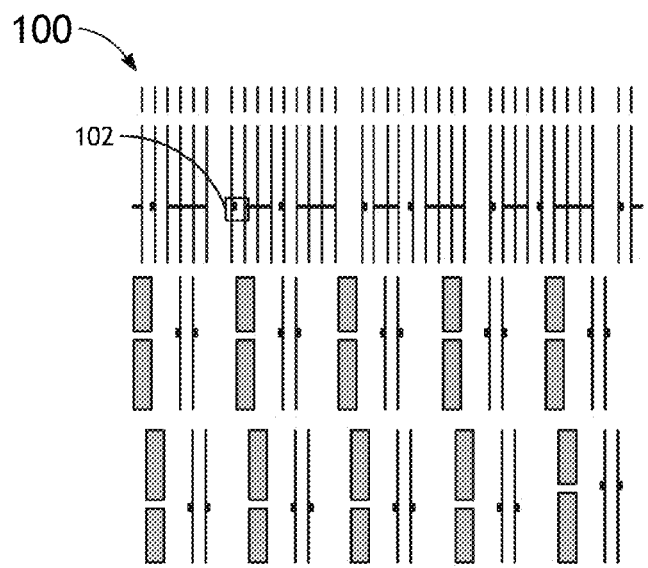
FIG. 1A illustrates a simplified view of a portion of a gray-tone image usable by a maskless reflective electron beam lithography system to print an integrated circuit pattern onto or more substrates, in accordance with one embodiment of the present invention.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIGS. 1A through 6, a system for data compression and transmission in a lithography system is described, in accordance with the present invention.

The present invention is directed to a data compression, transmission and decompression technique suitable for aiding in reducing the data transmission limitations associated with maskless electron beam lithography, such as maskless reflective electron beam lithography (REBL). In the case of integrated circuitry data, characteristics of particular importance include: (i) the ability to perform 'lossless' compression (i.e., the data recovered after de-compression is identical to the data prior to compression); (ii) the decompression method should be sufficiently simple that it can be accomplished at high speed with relatively simple electronics; (iii) the decompression method should have a low risk of 'excess latency' (i.e., cases for which data decompression lags behind the demand for data); and (iv) the compressed data set should be 'stream-oriented.' In this sense, the stream-oriented compressed data set should be capable of being decompressed in a continuous manner rather than a 'batch' manner, which is often suitable in other compression/decompression contexts, such as file compression/decompression. As such, the proper choice of compression method for a given system is not necessarily one providing the highest available compression ratio. Rather, the compression method of the present invention is one that facilitates the design of the overall system.

It is noted herein that a REBL system utilizes a raster gray-tone image to print an integrated circuit pattern data onto one or more wafers. In one embodiment, the gray-scale is five bits, consisting of a range between 0-31. This enables feature edge placement resolution approximately $\frac{1}{20}$ of a pixel diameter. Further, since the resist on which the gray-scale pattern is printed is a non-linear recording medium, development of the resist normally produces sharp feature edges near the contours on which the absorbed energy equals a threshold value. A rule-of-thumb in REBL is that to print a line of a given width (or critical dimension (CD)), the diameter of the pixel of the exposure system should not exceed about 0.4× that CD.

Integrated circuit patterns are inherently two-dimensional, unlike most data streams (e.g., text), which are normally considered one-dimensional. However, for purposes of transmission, the gray-tone data is necessarily converted to a one-dimensional time series. As such, it is advantageous to fold a portion of the two-dimensional structure inherent in a given integrated circuit pattern into the corresponding one-dimensional transmitted data stream, as it leads to an improvement in the code efficiency. Accordingly, a compression scheme which utilizes characters approximately 3×3 pixels in size is well-suited for expressing information in a gray-tone integrated circuit pattern. The data compression method and system of the present invention incorporates this principle.

Figure 1B:
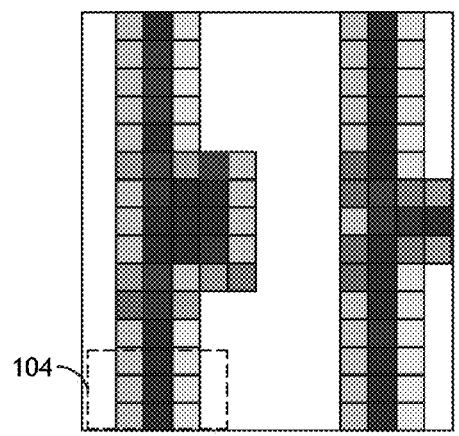
FIG. 1B illustrates a simplified view of a set of pixels of a portion of a gray-tone image, in accordance with one embodiment of the present invention.
Figure 1C:
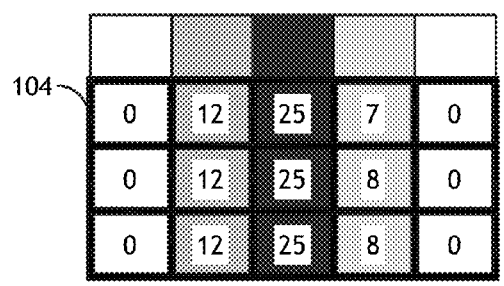
FIG. 1C illustrates a simplified view of a set pixels of a portion of a gray-tone image with a superposed grid for highlighting pixel boundaries and gray-level values of the pixels, in accordance with one embodiment of the present invention.

FIGS. 1A-1C illustrate simplified views of a gray-tone image 100 suitable for compression by the methods and system of the present invention. FIG. 1A illustrates a small portion of an integrated circuit pattern rendered in a gray-tone format. In one embodiment, the pixels of the image 100 are assigned gray-values within a selected numerical range. For example, the pixels of image 100 may be assigned a gray-tone value between 0 and 31, wherein a higher number corresponds to a darker gray tone. FIG. 1B illustrates image 102 corresponding with a portion of image 100. In this sense, image 102 is a zoomed in view of a small portion 102 of image 100. Further, FIG. 1C illustrates image 104 corresponding with a portion of image 102 (and even a smaller portion of image 100). Further, a grid is superposed onto image 102 to illustrate the pixel boundaries and the gray-tone values (numbered between 0-31) associated with each pixel within a grid cell. It is noted that this can be carried out for the entire image 100.

Figure 2A:
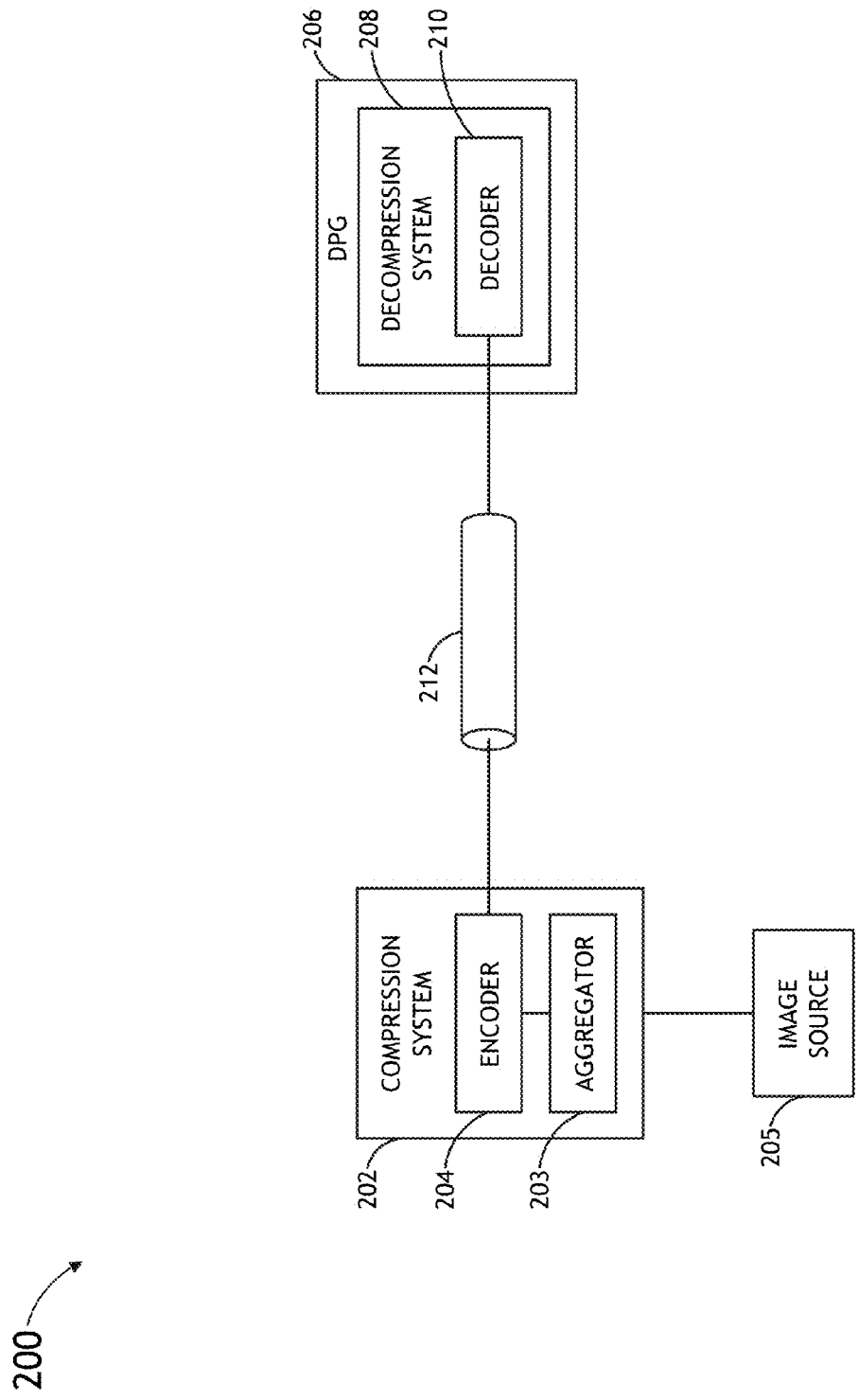
FIG. 2A illustrates a block diagram view of a system for compressed data transmission from an encoder to a decoder of a digital pattern generator, in accordance with one embodiment of the present invention.
Figure 2B:
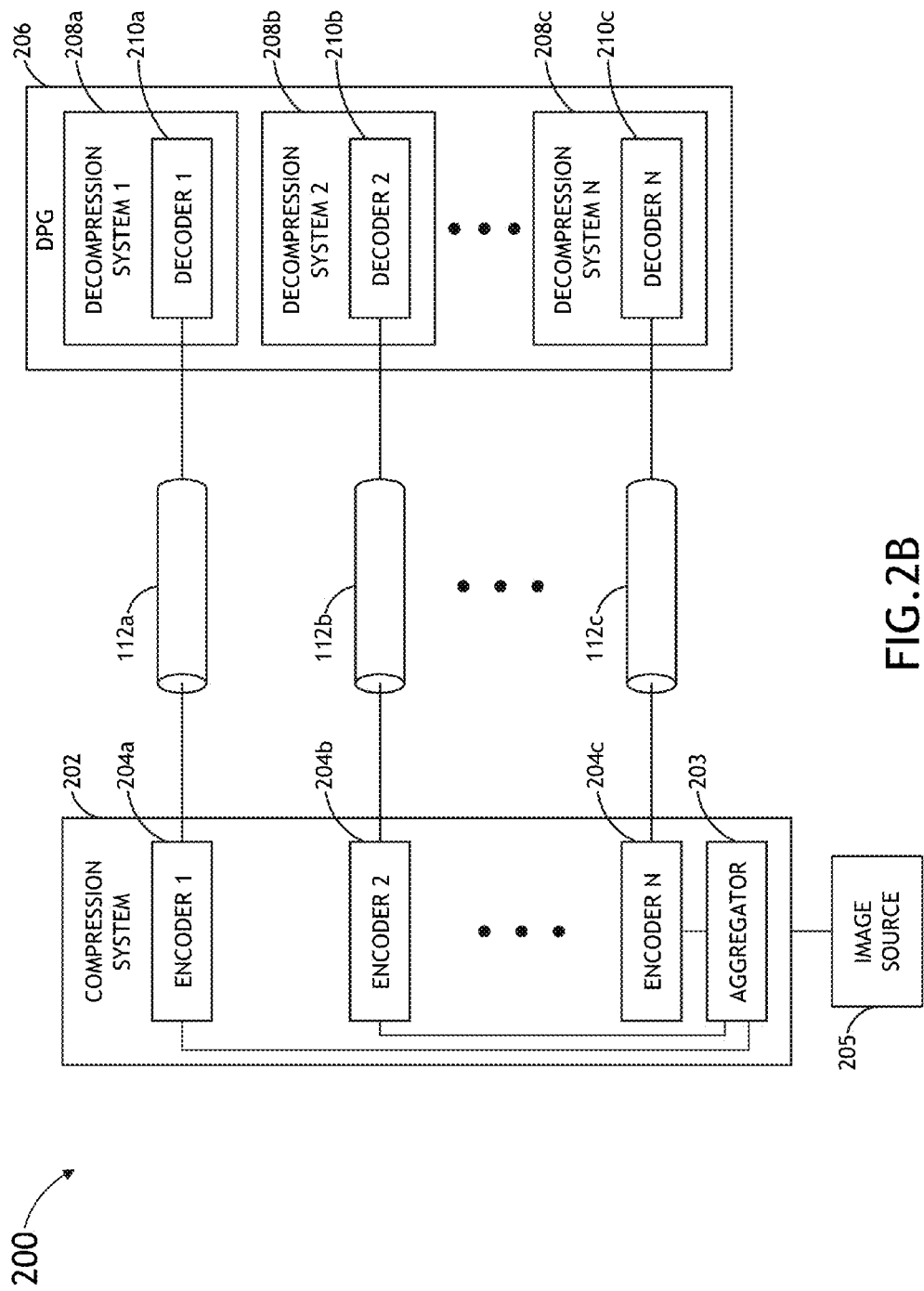
FIG. 2B illustrates a block diagram view of a system for compressed data transmission from a set of encoders to a set of decoders of a digital pattern generator, in accordance with one embodiment of the present invention.

FIGS. 2A and 2B illustrate a block diagram view of a system 200 for compressed data transmission in a lithography system, in accordance with embodiments of the present invention. Reflective electron beam lithography using a digital pattern generator and associated data compression techniques are described in detail in U.S. Pat. No. 7,704,653 to Lordi et al., issued on Apr. 27, 2010, which is incorporated herein by reference in the entirety. Applicant notes that Lordi et al. refer to the digital pattern generator as a "dynamic pattern generator." For the purposes of the present disclosure these terms should be interpreted as equivalent. Further, reflective electron beam lithography using CMOS controlled digital pattern generator chips is described in detail by Gubiotti et al. in "Reflective electron beam lithography: lithography results using CMOS controlled digital pattern generator chip," Proc. SPIE 8680, Alternative Lithographic Technologies V, 86800H (Mar. 26, 2013), which is incorporated herein by reference in the entirety.

Referring now to FIG. 2A, in one embodiment, the system 200 includes compression system 202 for compressing one or more gray-tone images usable by an electron beam lithography system (e.g., maskless REBL) to print a pattern onto a selected substrate (e.g., silicon wafer). In another embodiment, the compression system 202 includes a triline aggregator 203 for aggregating lines of one or more gray-tone images into trilines. In another embodiment, the compression system 202 includes one or more triline encoders configured to sequentially encode the trilines of the gray-tone image following aggregation.

In another embodiment, the system 200 includes a digital pattern generator (DPG) 206. For example, the DPG 206 of system 200 may consist of a DPG of a reflective electron beam lithography system (e.g., see FIG. 6). In another embodiment, the DPG of system 200 includes one or more decompression systems 208. In a further embodiment, the one or more decompression systems 208 includes one or more decoders 210 for decompressing the compressed data transmitted from the one or more encoders 204 via the data path 212.

In another embodiment, the system 200 includes, but is not required to include, an image source 205 communicatively coupled to the compression system 202. In this regard, the compression system 202 may retrieve one or more gray-tone images from the image source 205. In one embodiment, the triline aggregator 203 may receive one or more gray-tone images from image source 205 and aggregate the lines of the one or more gray-tone images into sets of trilines.

It is recognized herein that the image source 205 and the compression system 202 may be communicatively coupled in any manner known in the art. For instance, the image source 205 and the compression system 202 may be communicatively coupled via a wireline or wireless connection. In another embodiment, the image source 205 is positioned proximate to the compression system 202. In another embodiment, the image source 205 is disposed within the same external housing of the compression circuitry 202. In another embodiment, the image source 205 is positioned remotely with respect to the compression circuitry 202. In this regard, the image source 205 and compression system 205 may be placed in communication via a common network (e.g., internet, intranet and the like).

The image source 205 may include any known memory device suitable for storing gray-tone imagery data. For instance, the image source 205 may include, but is not limited to, random access memory (RAM), read-only memory (ROM), or a persistent store, such as a mass storage device, hard drives, CDROM, DVDROM, tape, erasable programmable read-only memory (EPROM or flash memory), any magnetic, electromagnetic, infrared, optical, or electrical system, apparatus or device for storing information, or any other type of media suitable for storing electronic data, and capable of being coupled to the compression circuitry 202.

In another embodiment, the one or more encoders 204 of the compression system 202 may transmit the encoded/compressed gray-tone image data to the one or more decoders of the DPG 206. In another embodiment, the compressed gray-tone image data may be transmitted to the one or more decoders of the DPG 206 via a data pathway 212. For example, the compressed gray-tone image data may be transmitted to the one or more decoders of the DPG 206 via one or more fiber optic links established between the encoding circuitry of compression system 202 and the decoding circuitry of the DPG 206.

Referring now to FIG. 2B, a preferred embodiment of the system 200 for compression and decompression of one or more gray-tone images usable by a REBL system is illustrated. Applicant notes that the description of the embodiments and functionality associated with FIG. 2A should be interpreted to extend to FIG. 2B, unless otherwise noted. Likewise, the embodiments and functionality associated with FIG. 2B should be interpreted to extend to FIG. 2A, unless otherwise noted.

In one embodiment, the compression system 202 includes one or more aggregators 203 for receiving a gray-tone image from the image source 205. In another embodiment, the one or more aggregators serve to aggregate a set of lines of each of a set of regions of the gray-tone image into trilines. Referring again to FIGS. 1A-1C, and by way of example, the aggregation of lines into trilines may be carried out similar to the following procedure. First, the three "0's" in the left-most column may be bit-wise concatenated (in top-middle-bottom sequence) into a 15-bit value stored as a 16-bit hexadecimal expression 0x0000. Second, in the next column, the repeating "12's" can be bit-wise concatenated into a 15-bit value stored as the 16-bit hexadecimal value 0x318C. Third, the repeating "25's" can be bit-wise concatenated into a 15-bit value stored as a 16-bit hexadecimal value of 0x6739. Finally, the non-repeating values of (7,8,8) in the fourth column may be bit-wise concatenated and stored as a 16-bit hexadecimal value of 0x1D08. It is noted herein that the above described aggregation process and the values listed above are not limiting and are provided merely for illustrative purposes.

In another embodiment, the compression system 202 includes multiple encoders. For example, the compression system 202 may include a first encoder 204a, a second encoder 204b and up to and including an Nth encoder 204c. In another embodiment, following the aggregation of image lines into trilines, the encoders 204a-204c sequentially encode the trilines of the set of regions of the gray-tone image. For example, a given encoder (e.g., 204a-204c) may sequentially encode one or more trilines from a given region of the gray-tone image. While represented as a single aggregator 203 in FIG. 2B, it is noted herein that, in another embodiment, the compression system 202 may include multiple aggregators 203. In this sense, each of the multiple aggregators may correspond with a given encoder (e.g., 204a-204c).

In one embodiment, the encoders 204a-204c of compression system 202 are equipped with one or more codebooks configured to store triline fragments and a write location. In a further embodiment, the one or more codebooks associated with the encoders 204a-204c consist of an associative memory capable of storing a modest number of triline fragments. For example, the one or more codebook may be capable of storing up to 1024 triline fragments, each consisting of 1, 2 or 3 hexadecimal values. In another embodiment, the one or more codebook includes a write location, which may be initialized to 0.

In another embodiment, the system 200 includes one or more decompression systems 208a-208c. In one embodiment, the system 200 may include multiple decompression systems 208a-208c, each with a decoder 210a, 210b or 210c, as shown in FIG. 1B. For example, the decompression systems 208a-208c may consist of multiple copies of a decompression circuit of a DPG 206, with each decompression circuit including at least one decoder. Although not shown, it is further recognized herein that, in another embodiment, the DPG may include a single decompression system including multiple copies of a decompression circuit, with each decompression circuit including at least one decoder.

Figure 3B:
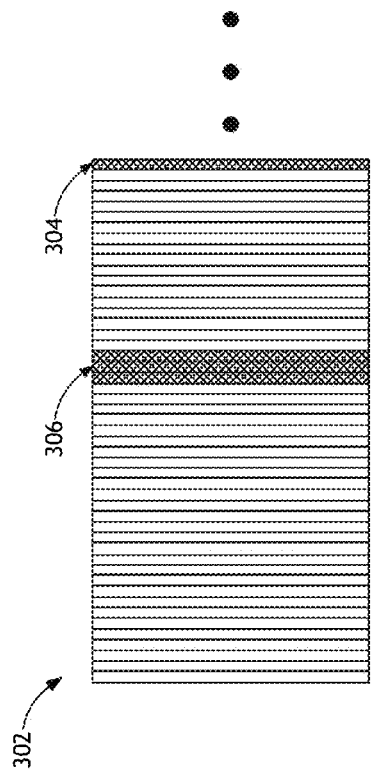
FIG. 3B illustrates a simplified schematic view of a single segment of a digital pattern generator of a reflective electron beam lithography system, in accordance with one embodiment of the present invention.
Figure 3A:
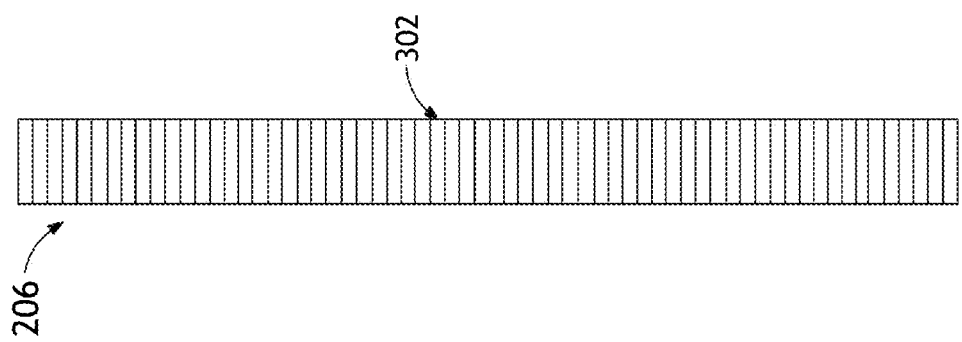
FIG. 3A illustrates a simplified schematic view of an entire digital pattern generator of a reflective electron beam lithography system, in accordance with one embodiment of the present invention.

In one embodiment, the DPG 206 of system 200 is designed as a collection of 'segments.' FIGS. 3A and 3B depict a simplified view of an entire DPG 206 and the segments 302 that make up the DPG 206, in accordance with an embodiment of the present invention. In one embodiment, the DPG 206 of FIG. 3A is composed of 64 segments (e.g., segment 302). In another embodiment, each segment 302 is 64 pixel-rows tall. As such, the entire DPG 206 may be 4096 pixel-rows tall. In another embodiment, each segment 302 is supplied with a separate data stream. FIG. 3B depicts a conceptual view of the overall structure representative of the data stream supplied to an individual segment 302. Further, region 304 represents a single 64-pixel line of gray data, whereby region 306 represents a triline, consisting of three aggregated lines of 64 pixel values.

In another embodiment, each of the set of decoders 210a-210c corresponds with one of the segments of the digital pattern generator 206. In this regard, each segment 302 may behave functionally as a mini-DPG, whereby each segment 302 has a dedicated data stream (e.g., 212a-212c) and decoder (e.g., 210a-210c). In this sense, the decompression systems 208a-208c of FIG. 2B may each be considered to correspond with one of a set of segments of the DPG 206. By way of example, in the case where each of the segments is 64 pixels tall and the gray-tone image being encoded is N pixels wide by M pixels tall, a given encoder 210a-210c will operate on a portion of the gray-tone image that is N pixels wide×64 pixels tall. In this regard, each encoder 210a-210c corresponds with one of the decoders 210a-210c.

In another embodiment, the encoders 204a-204c of the compression system 202 may transmit the encoded/compressed gray-tone image data to the decoders 210a-210c of the DPG 206. For example, a first encoder 204a may transmit each of the encoded trilines of a first region of the gray-tone image to a first decoder 210a of a first segment of the digital pattern generator 206. In addition, a second encoder 204b may transmit each of the encoded trilines of a second region of the gray-tone image to a second decoder 210b of a second segment of the digital pattern generator 206. Further, an Nth encoder 204c may transmit each of the encoded trilines of an Nth region of the gray-tone image to an Nth decoder 210c of an Nth segment of the digital pattern generator 206.

In another embodiment, the compressed gray-tone image data may be transmitted to each of the decoders of the DPG 206 via a set of data pathways 212a-212c. For example, the compressed gray-tone image data may be transmitted to the decoders 210a-210c of the DPG 206 via a set of fiber optic links established between each of the encoders 204a-204c of the encoding circuitry of compression system 202 and the decoders 210a-210c of the decoding circuitry of the DPG 206, as shown in FIG. 2B.

In another embodiment, each region of the gray-tone image corresponds to, or can be mapped to, one of the segments 302 of the DPG (e.g., DPG of the REBL system). In another embodiment, following aggregation, each of the encoders 204a-204c transmit the encoded trilines of a given region of the image to a decoder of a segment corresponding with the region. For example, imagery data from a region of the gray-tone image that is to be mapped to a given segment 302 of the DPG 206 may be aggregated by the aggregator 203 and then encoded by an encoder (e.g., 204a, 204b or 204c) in communication with the given segment via a given data path (e.g., 112a, 112b or 112c), as shown in FIG. 2B.

In one embodiment, although not shown, the compression/decompression system(s) described herein may further include a non-transitory storage medium (i.e., memory medium) containing program instructions configured to cause one or more processing elements of the compression/decompression system(s) to carry out one or more of the various steps described throughout the present disclosure. The memory medium may include memory medium known in the art such as random access memory (RAM), read-only memory (ROM), or a persistent store, such as a mass storage device, hard drives, CDROM, DVDROM, tape, erasable programmable read-only memory (EPROM or flash memory), any magnetic, electromagnetic, infrared, optical, or electrical system, apparatus or device for storing information, or any other type of media suitable for storing electronic data. In general, the term "processing element" may be broadly defined to encompass any device having processing or logic capabilities, which execute instructions from a memory medium. For example, the one or more processing elements of the compression/decompression system(s) may include any microprocessor-type device configured to execute software algorithms and/or instructions. In one embodiment, the one or more processing elements may consist of a desktop computer or other computer system (e.g., networked computer) configured to execute a program configured to operate one or more components of compression/decompression system(s), as described throughout the present disclosure. It should be recognized that the steps described throughout the present disclosure may be carried out by a single computer system or, alternatively, multiple computer systems. In another embodiment, the processing element(s) may include a single or multi-core processor.

In another embodiment, the processing capabilities of the decompression/decoding system(s) of the DPG may be carried out by any means known in the art of DPG enabled reflective electron beam lithography. For example, the DPG may include one or more logic elements (e.g., CMOS devices). For instance, some or all of the processing requirements of the DPG 206 may be carried out utilizing one or more CMOS devices.

It is noted herein that while the system 200 of the present invention as shown in FIGS. 2A-2B depicts a one-to-one correspondence between encoders and decoders, this should not be interpreted as a necessary limitation. It is recognized herein that, in some embodiments, a single encoder of the compression system 202 may encode gray-tone data and transmit the encoded data to multiple decoders of the DPG 206.

More generally, the illustrated separation of logic, modules, components, systems, and functionality into distinct units may reflect an actual physical grouping and allocation of software, firmware, and/or hardware, or can correspond to a conceptual allocation of different tasks performed by a single software program, firmware program, and/or hardware unit. The illustrated logic, modules, components, systems, and functionality can be located at a single site (e.g., as implemented by a processing device), or can be distributed over plural locations.

In another embodiment, although not shown, the various components of the present invention, such as the compression and decompression systems, may include numerous other components and sub-systems, which have been excluded from the present disclosure for purposes of brevity. For example, it is recognized herein that the compression and decompression systems described throughout the present invention may include various signal transmission and processing elements (e.g., transmitters, receivers and the like) required for signal transmitting, receiving and processing the various signals (e.g., optical signals and RF signals) of the present invention.

Figure 4:
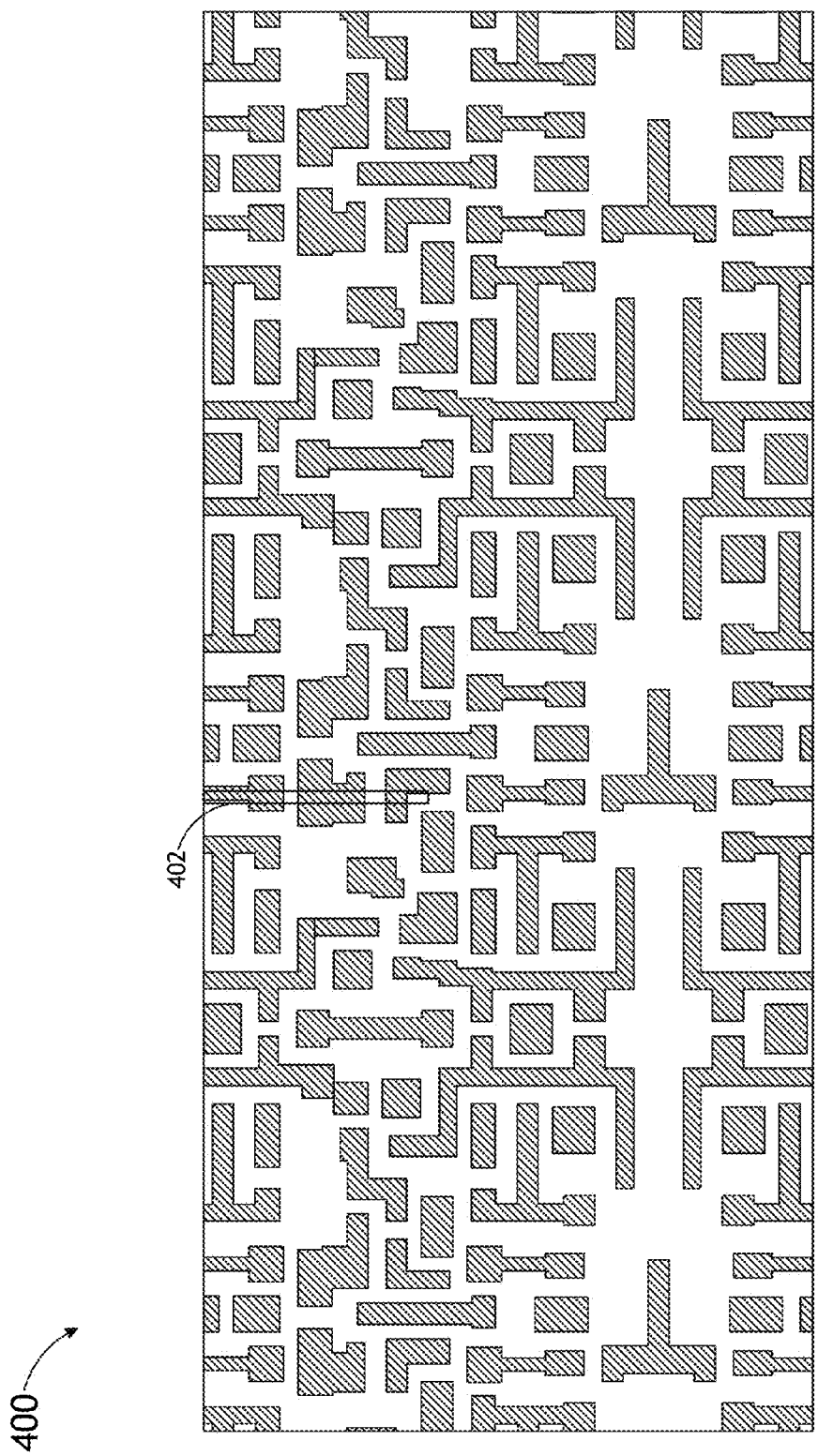
FIG. 4 illustrates a simplified schematic view of an integrated circuit pattern suitable for compression, transmission and decompression, in accordance with one embodiment of the present invention.

FIG. 4 represents a gray-tone image suitable for processing by the compression/decompression system of the present invention. In a first step, one or more aggregators 203 may apply the triline composition process (as described above) to the uppermost 64 rows of image 400. Applicant notes that this process is similar to that carried out with respect to FIG. 1A. Applicant points out, however, that the rows of FIG. 1A run horizontally, while the rows of FIG. 4 run vertically, as indicated by rectangle 402 of FIG. 4. Following the triline aggregation process, the one or more aggregators 203 output N/3 trilines, each containing 64 hexadecimal triples (i.e., 16-bit values concatenated from three 5-bit pixels). In a further step, the encoders 204a-204c may sequentially encode each of the trilines (e.g., right-to-left in FIG. 4). In another step, the encoders 204a-204c may execute a sequential encoding process on each of the trilines of image 400. The encoding process utilized to sequentially encode each triline may include the operation of one or more of encoders 204a-204c to execute a first pass of a given triline in a region of the gray-tone image. The encoding process may further include executing a second pass of the given triline by operation of one or more of encoders 204a-204c. Further, the output string of the fully process first pass may serve as the input string of the second pass output.

Figure 5:
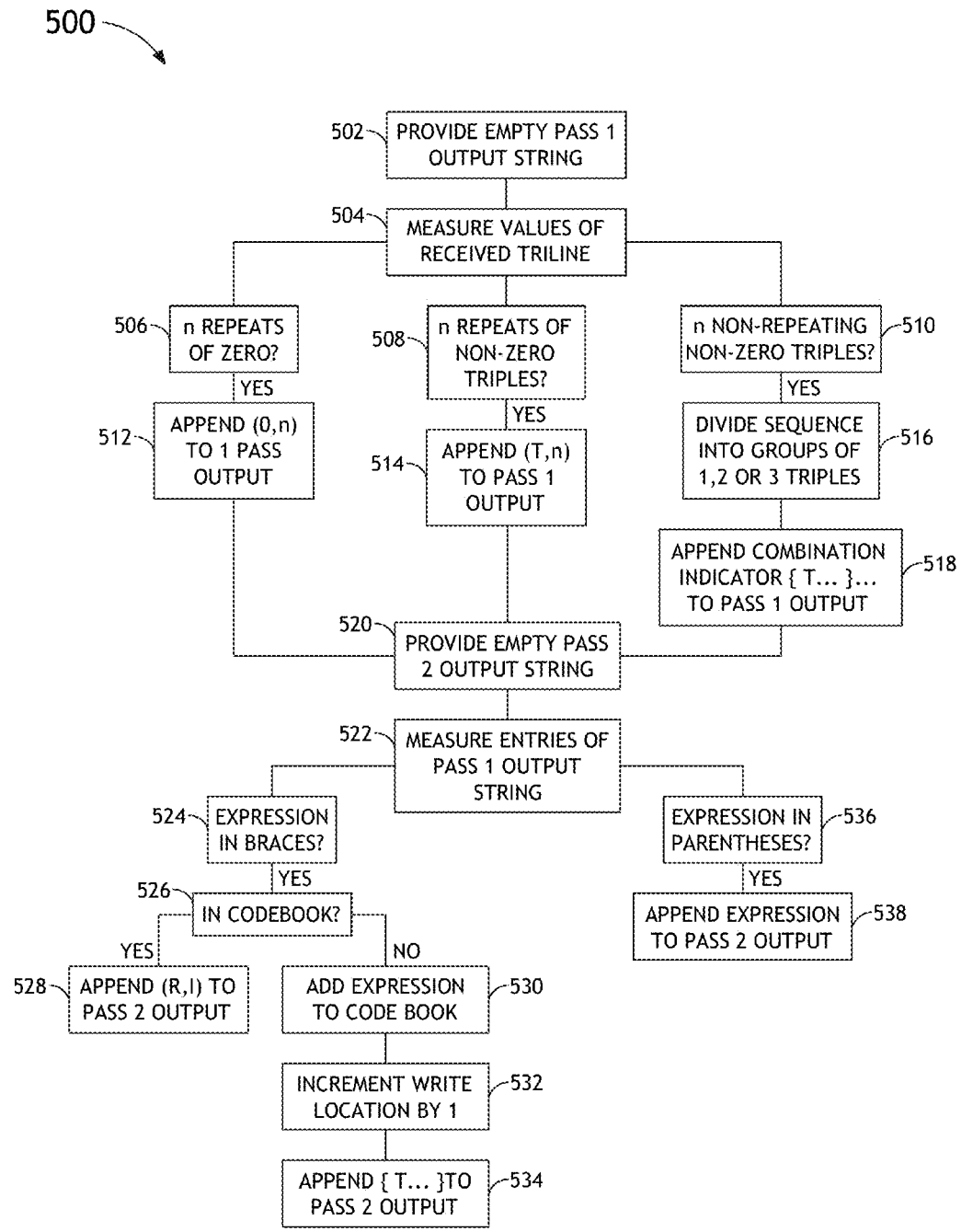
FIG. 5 illustrates a process flow diagram of a triline encoding process, in accordance with one embodiment of the present invention.

FIG. 5 illustrates a triline encoding process suitable for encoding a triline, in accordance with one embodiment of the present invention. In one embodiment, the encoding process includes executing a first pass of the triline with one of the encoders (e.g., 204a-204c). In a first step 502 of pass 1, an empty pass 1 output string is provided. In a second step 504 of pass 1, the values of the triline are measured from the beginning to the end of the triline. In the event a sequence of n repeats of zero is encountered 506, the system 200 appends a zero repeat textual indicator expression indicative of a sequence of n repeats of zero to the first pass output string. For example, the zero repeat textual indicator expression may consist of '(0, n).' In the event a sequence of n repeats of a non-zero triple (T) is encountered 508, the system 200 appends a non-zero triple repeat textual indicator indicative of a sequence of n repeats of a non-zero triple to the first pass output string. For example, the zero repeat textual indicator expression may consist of '(T,n),' where T represents the triple value.

Applicant notes that parentheses have been utilized in the presented example to indicate a repeat of values. It is noted, however, that the present invention is not limited to this textual device and any symbolic expression may be utilized to represent repeating values of zero or non-zero values or expressions.

In the event a sequence of n non-repeating non-zero triples is measured 510, the triples are divided 516 into groups of 1, 2 or 3 in length. In turn, the system 200 appends 518 a non-repeating non-zero textual indicator indicative of a combination of the 1, 2 or 3 sized triple groups to the first pass output string. In this regard, each group of triples may be represented with a non-repeating non-zero textual indicator. For example, each group having 1, 2 or 3 triples may be represented in braces by expressions such as $\{T_i\}$, $\{Ti, Tj\}$ and $\{Ti, T_j, T_k\}$ respectively. As such, a combination of groups may be represented by any combination of $\{T_i\}$, $\{T_i, T_j\}$ and $\{T_i, T_j, T_k\}$. For example, in the event a string of eight non-zero triples (T0, T1, . . . , T7) is encountered, the system 200 may append the textual indicator "{T0,T1,T2}{T3,T4,T5}{T6,T7}" to the pass 1 output string. Applicant notes that braces have been utilized in the presented example to indicate grouping of non-repeating non-zero values. It is noted, however, that the present invention is not limited to this textual device and any symbolic expression may be utilized to represent non-repeating non-zero values or expressions.

In one embodiment, the encoding process 500 includes executing a second pass of the triline. It is noted herein that the pass 1 output is equivalent to the starting triline in that it can be reverse-transcribed to reproduce the starting triline exactly. The starting triline may be discarded, whereby the pass 1 output is utilized as the input to the second pass. We now discard the starting triline and use pass 1 output as the input to pass 2.

In a first step 520 of pass 2 of the triline, an empty second pass output string is provided. In this regard, a fully processed first output string serves as an input to the second pass. In the event one or more components of the non-repeating non-zero textual indicator (of steps 516-518) is encountered 524, the system 200 checks the codebook 526 associated with the given encoder (e.g., 204a-204c). Upon determining the at least one component of the non-repeating non-zero textual indicator is in the codebook at write location I, the system 200 appends 528 a codebook reference indicator to the second pass output string, where the codebook reference indicator is indicative of the inclusion of the at least one component of the non-repeating non-zero textual indicator at the write location I.

Upon determining the at least one component of the non-repeating non-zero textual indicator is not in the codebook, the system 200 may add the at least one component of the non-repeating non-zero textual indicator to the codebook at the write location I 530. Further, the system 200 may increment 532 the write location by 1, wrapping around (back to 0) if it exceeds 1023 (the largest usable write address), and append the at least one component of the non-repeating non-zero from the first pass output to the second pass output 534.

For example, in the case where the at least one component of the non-repeating non-zero textual indication is represented with braces (e.g., {T . . . }), when an expression in braces {T . . . } is encountered 524, the system 200 may check the codebook 526 for such an expression. In the event the expression in braces is in the codebook at write location I, the system 200 may append "(R,I)" to the pass 2 output string. In the event the expression in braces is not in the codebook, the system 200 may add the expression in braces {T . . . } to the codebook at the write location 1530. Further, the system 200 may increment 532 the write location by 1, wrapping around (back to 0) if it exceeds 1023, and append the expression {T . . . } from the first pass output to the second pass output.

In the event a zero repeat textual indicator (e.g., (0,n)) or a non-zero repeat textual indicator (e.g., (T,n)) is encountered 536, the system 200 appends the encountered zero repeat textual indicator or non-zero repeat textual indicator to the second pass output string.

It is noted herein that the pass 1 output can no longer be reconstructed using only the pass 2 output as a result of part of the required information having been placed in the codebook. However, a properly designed decoder, one which constructs the codebook in the same sequence as that used by the particular encoder (e.g., 204a-204c), will reconstruct the original sequence of trilines. As such, in another embodiment, a given decoder (e.g., 210a-210c) is configured to construct the codebook in the same sequence utilized by the corresponding encoder (e.g., 204a-204c).

In another embodiment, the zero repeat textual indication, the non-zero triple T repeat textual indicator and at least one component of the non-repeating non-zero textual indicator may be replaced by a few-bit op-codes in order to complete the code definition. In the case of textual indicators consisting of parenthesis and braces, the expressions (R, . . . ), {T, . . . } and etc. may be replaced by few-bit op-codes to complete the code definition. For example, a 3-bit op-code may be implemented.

It is noted herein that the code required to execute the process described above is generally efficient. This is because (a) the associated codebook contains references to frequently-used sequences of triples, so short addresses (e.g., 10 bits) can be used to reproduce relatively long sequences (e.g., 45 bits); (b) repeated symbols are encoded efficiently, using run-length encoding where applicable; and (c) the code is adapted to the structure of the integrated patterns (as discussed above). Applicants note that compression ratios have been achieved in the range of 4 to 20.

Figure 6:
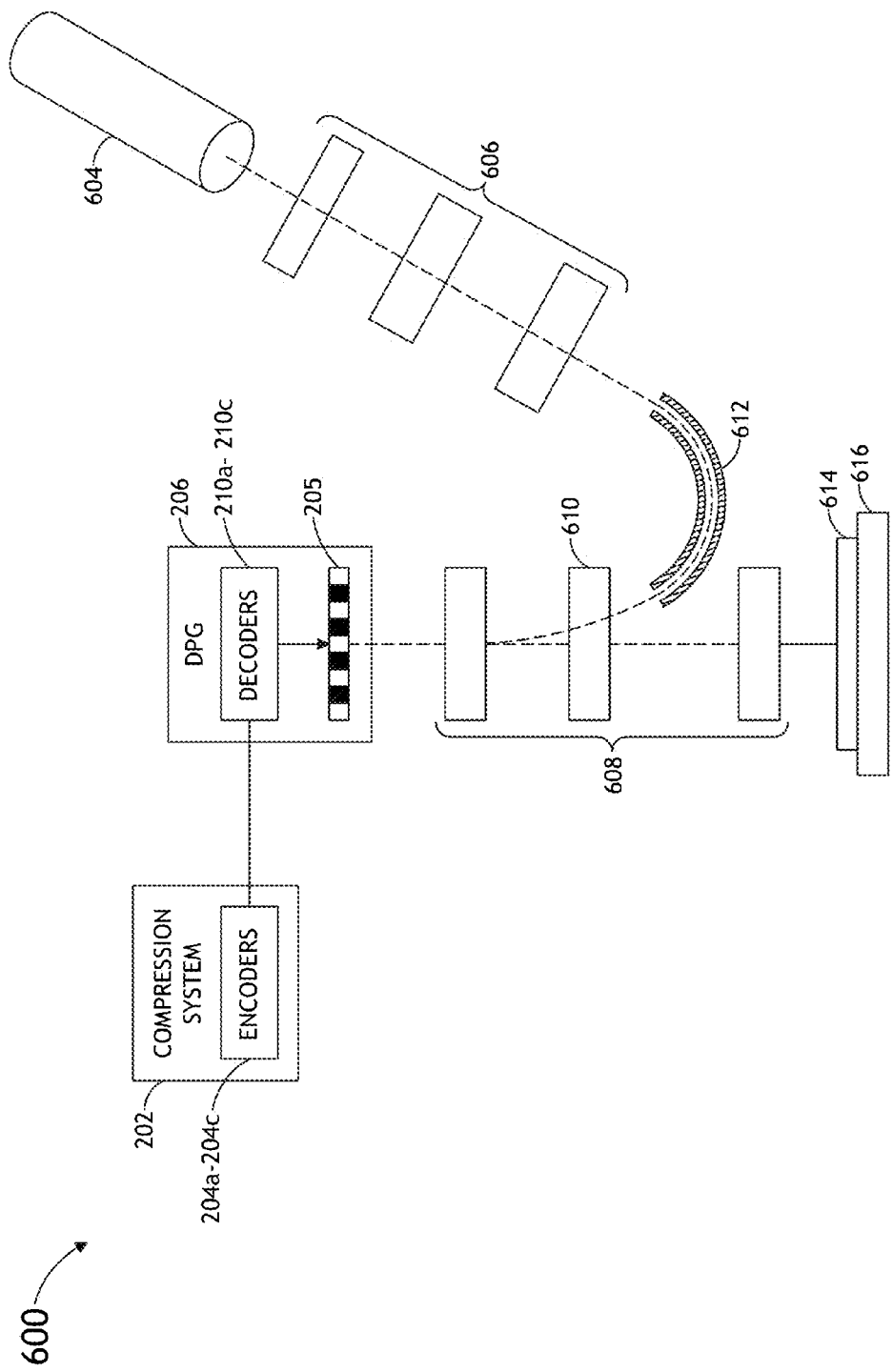
FIG. 6 illustrates a simplified schematic diagram of reflective electron beam lithography system equipped with data compression, transmission and decompression capabilities, in accordance with one embodiment of the present invention.

FIG. 6 illustrates a simplified schematic view of a reflective electron beam lithography system equipped with the compressed data transmission capabilities of the present invention.

The REBL system 600 may include an electron gun 604, a set of illumination optics 606, and an e-beam bender 612, which together act to direct an electron illumination beam onto the digital pattern generator 206. The DPG 206 is used for generating patterns on the wafer, whereby the pattern 205 of the DPG is programmable. In this regard, the one or more decoders 210-210c of the DPG may receive the compressed data from the one or more encoders 204a-204c of the compression system 202, as described throughout the present disclosure. In turn, the programmable reflective pattern surface 205 generates a reflected pattern in response to the decoded image gray-tone image data from the decoders 210a-210c (associated with the segments (not shown) of the DPG). Projection optics 608 are utilized to direct a projection e-beam from the surface 205 of the DPG chip 206 onto the surface of the one or more wafers 614 disposed on a lithography stage 616. The projection optics 608 may include an ExB filter 610 (e.g., Wien Filter) consisting of crossed electrostatic and magnetic deflection fields suitable for separating the projection beam from the illumination beam.

While the current disclosure discusses the method and system for data compression in the context of the transmission of integrated circuitry pattern data in a REBL system, it is noted herein that the compression and decompression techniques may be extended to any environment involving the transmission of gray-tone data to a digital pattern generator or equivalents, as discussed throughout the present disclosure.

The embodiments of the system 200 illustrated in FIGS. 2A-2B may be further configured as described herein. In addition, the system 200 may be configured to perform any other step(s) of any of the method embodiment(s) described herein.

Figure 7A:
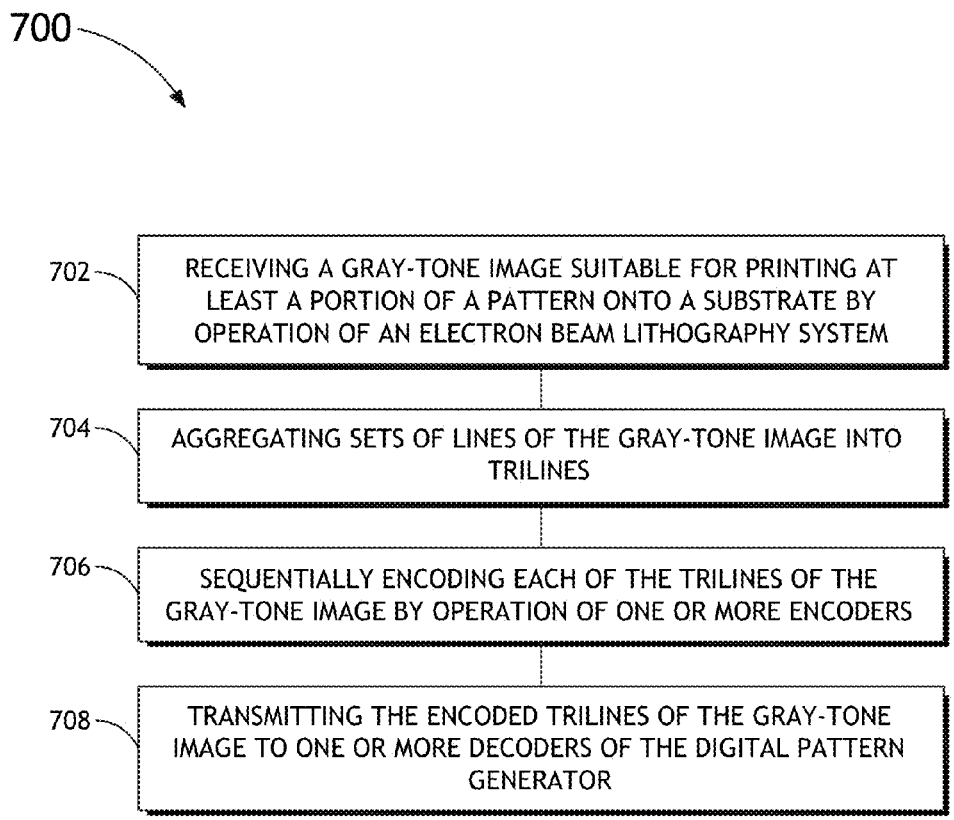
FIG. 7A illustrates a process flow diagram of a method for compressed data transmission, in accordance with one embodiment of the present invention.

FIG. 7A illustrates a process flow 700 for compressed data transmission in an electron beam lithography system, in accordance with one embodiment of the present invention. In step 702, a gray-tone image suitable for printing at least a portion of a pattern onto a substrate by operation of an electron beam lithography system is received. In step 704, sets of lines of the gray-tone image into trilines are aggregated. In step 706, each of the trilines of the gray-tone image is sequentially encoded by operation of one or more encoders (e.g., 204a-204c). Further, the one or more encoders are equipped with a codebook configured to store a plurality of triline fragments and a write location. In step 708, the encoded trilines of the gray-tone image are transmitted to a set of decoders of the digital pattern generator via a set of data pathways (e.g., optical fiber links) established between the one or more encoders and each of the decoders.

Applicant notes that the above ordering of steps should not be interpreted as limiting. It is anticipated that at least a portion of the steps of process 700 may be carried out in a different order.

Figure 7B:
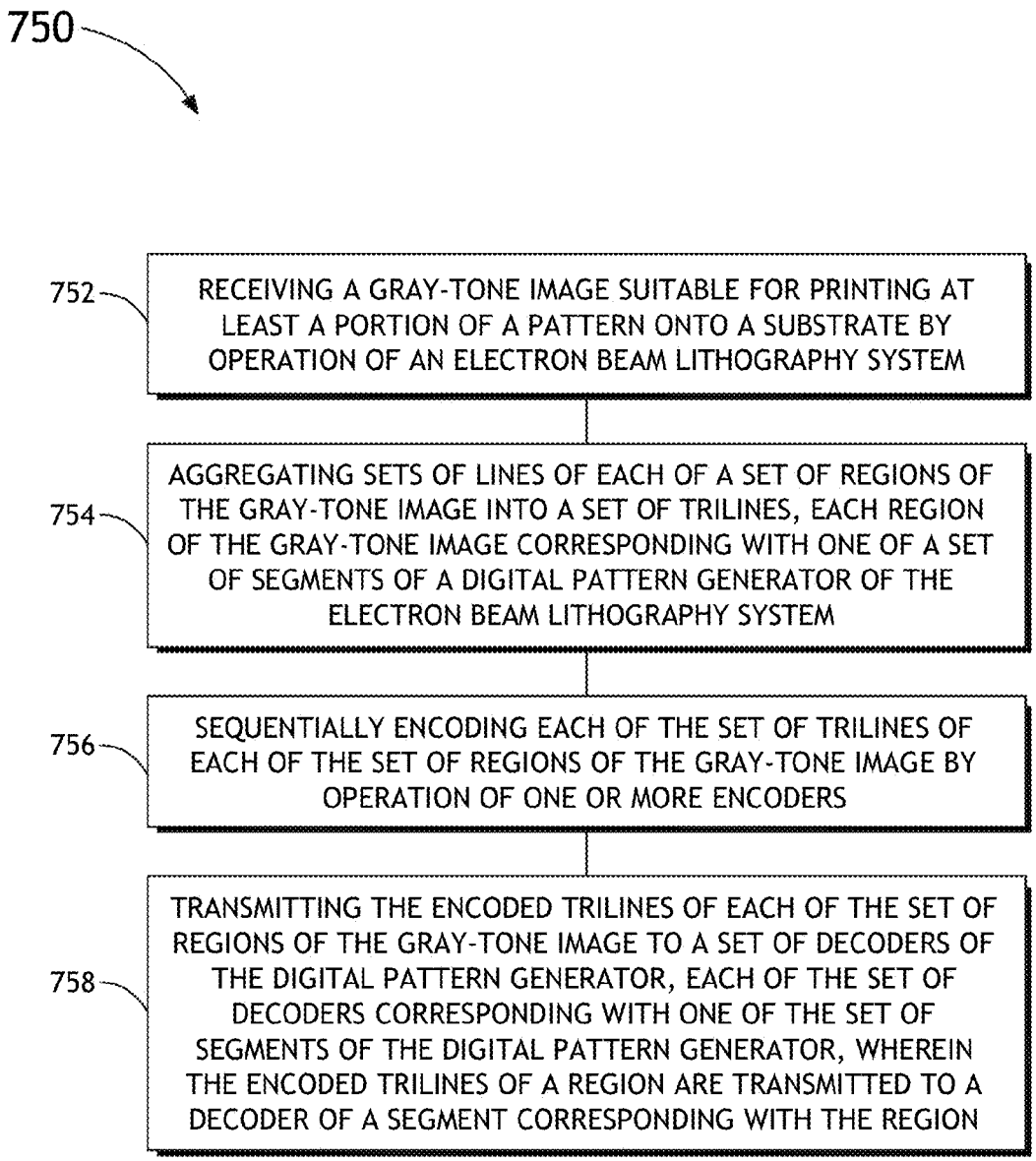
FIG. 7B illustrates a process flow diagram of a method for compressed data transmission, in accordance with one embodiment of the present invention.

FIG. 7B illustrates a process flow 750 for compressed data transmission in an electron beam lithography system, in accordance with one embodiment of the present invention. In step 752, a gray-tone image suitable for printing at least a portion of a pattern onto a substrate by operation of an electron beam lithography system is received. In step 754, the sets of lines of each of a set of regions of the gray-tone image are aggregated into trilines. Further, each region of the gray-tone image corresponds with one of a set of segments of a digital pattern generator of the electron beam lithography system. In step 756, each of a set of trilines of each of the set of regions of the gray-tone image is sequentially encoded by operation of one or more encoders (e.g., encoders 204a-204c). Further, the one or more encoders equipped with a codebook configured to store a plurality of triline fragments and a write location. In step 758, the encoded trilines of the set of regions of the gray-tone image are transmitted to a set of decoders (e.g., decoders 210a-210c) of the digital pattern generator. Further, each of the set of decoders corresponds with one of the set of segments of the digital pattern generator. In this regard, the encoded trilines of a region may be transmitted to a decoder of a segment corresponding with the given region.

Applicant notes that the above ordering of steps should not be interpreted as limiting. It is anticipated that at least a portion of the steps of process 750 may be carried out in a different order.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops. A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A method for compressed data transmission in an electron beam lithography system comprising:
   receiving a gray-tone image suitable for printing at least a portion of a pattern onto a substrate by operation of an electron beam lithography system;
   aggregating sets of lines of each of a set of regions of the gray-tone image into trilines, each region of the gray-tone image corresponding with one of a set of segments of a digital pattern generator of the electron beam lithography system;
   sequentially encoding each of a set of trilines of each of the set of regions of the gray-tone image by operation of encoding circuitry according to an encoding process based on acquired gray-tone values of each of the set of trilines, the encoding circuitry having one or more encoders, the one or more encoders equipped with a codebook configured to store a plurality of triline fragments and a write location; and
   transmitting the encoded trilines of the set of regions of the gray-tone image to a set of decoders of the digital pattern generator, each of the set of decoders corresponding with one of the set of segments of the digital pattern generator, wherein the encoded trilines of a region are transmitted to a decoder of a segment corresponding with the region.

2. The method of claim 1, further comprising:
   prior to aggregating sets of lines of each of a set of regions of the gray-tone image into trilines, assigning gray-values to each of the pixels of the received gray-tone image, wherein the assigned gray-values are within a selected range.

3. The method of claim 1, wherein the encoding process further comprises:

executing a first pass of a triline; and
executing a second pass of the triline, wherein a fully processed first pass output string serves as an input to the second pass.

4. The method of claim 3, wherein the encoding process further comprises:
executing a first pass of a triline, wherein the first pass includes:
providing an empty first pass output string;
measuring each value of the triline from beginning of the triline to the end of the triline;
upon measuring a sequence of n repeats of 0, appending a zero repeat textual indicator to the first pass output string;
upon measuring a sequence of a non-zero triple T, appending a non-zero triple repeat textual indicator to the first pass output string;
upon measuring a sequence of n non-repeating non-zero triples, dividing the non-repeating non-zero triples into groups of 1, 2 or 3 triples and appending a non-repeating non-zero textual indicator indicative of a combination of the groups of 1, 2 or 3 triples to the first pass output string; and
executing a second pass of the triune, wherein the second pass includes:
providing an empty second pass output string, wherein a fully processed first pass output string serves as an input to the second pass output string;
upon encountering at least one component of the non-repeating non-zero textual indicator, checking for the at least one component of the non-repeating non-zero textual indicator in the codebook;
upon determining the at least one component of the non-repeating non-zero textual indicator is in the codebook at write location I, appending a codebook reference indicator to the second pass output string, wherein the codebook reference indicator indicates the inclusion of the at least one component of the non-repeating non-zero textual indicator at the write location I;
upon determining the at least one component of the non-repeating non-zero textual indicator is not in the codebook, adding the at least one component of the non-repeating non-zero textual indicator to the codebook at the write location I, incrementing the write location I by 1 and appending the at least one component of the non-repeating non-zero textual indicator from the first pass output string to the second pass output string; and
upon encountering a zero repeat textual indicator or a non-zero repeat textual indicator, appending the encountered zero repeat textual indicator or the non-zero repeat textual indicator unchanged to the second pass output string.

5. The method of claim 1, wherein the transmitting the encoded trilines of the set of regions of the gray-tone image to a set of decoders of the digital pattern generator comprises:
transmitting each of the encoded trilines of a first region of the set of regions of the gray-tone image to a first decoder of a first segment of the digital pattern generator; and
transmitting each of the encoded trilines of at least a second region of the set of regions of the gray-tone image to at least a second decoder of at least a second segment of the digital pattern generator.

6. The method of claim 1, wherein the one or more encoders comprise:
a set of encoders, wherein each of the set of encoders is configured to transmit a set of sequentially encoded trilines to one of the set of decoders of the digital pattern generator of the electron beam lithography system.

7. The method of claim 6, wherein the set of encoders are communicatively coupled to the set of decoders of the digital pattern generator via a set of fiber optic communication links.

8. The method of claim 1, wherein each of the set of decoders is configured to decode one or more signals received from a corresponding encoder of the set of encoders by constructing a codebook in the same sequence utilized by the corresponding encoder.

9. The method of claim 1, wherein the electron beam lithography system comprises:
a maskless electron beam lithography system.

10. The method of claim 9, wherein the maskless electron beam lithography system comprises:
a maskless reflective electron beam lithography system.

11. The method of claim 1, wherein the substrate comprises:
a semiconductor wafer.

12. A method for compressed data transmission in an electron beam lithography system comprising:
receiving a gray-tone image suitable for printing at least a portion of a pattern onto a substrate by operation of an electron beam lithography system;
aggregating sets of lines of the gray-tone image into trilines;
sequentially encoding each of the trilines of the gray-tone image by operation of an encoding circuitry configured to use an encoding process based on acquired gray-tone values of each of the set of trilines, the encoding circuitry having one or more encoders, the one or more encoders equipped with a codebook configured to store a plurality of triline fragments and a write location; and
transmitting the encoded trilines of the gray-tone image to decoding circuitry, the decoding circuitry having a set of decoders of the digital pattern generator via a set of data pathways established between the one or more encoders and each of the decoders.

13. The method of claim 12, further comprising:
prior to aggregating sets of lines of the gray-tone image into trilines, assigning gray-values to each of the pixels of the received gray-tone image, wherein the assigned gray-values are within a selected range.

14. The method of claim 12, wherein each of the set of decoders is configured to decode one or more signals received from the one or more encoders by constructing one or more codebooks in the same sequence utilized by the one or more encoders.

15. The method of claim 12, wherein the encoding process further comprises:
executing a first pass of a triline; and
executing a second pass of the triline, wherein a fully processed first pass output string serves as an input to the second pass.

16. The method of claim 12, wherein the encoding process further comprises:
executing a first pass of a triline, wherein the first pass includes:
providing an empty first pass output string;
measuring each value of a triline from beginning of the triline to the end of the triline;
upon measuring a sequence of n repeats of 0, appending a zero repeat textual indicator to the first pass output string;

upon measuring a sequence of a non-zero triple T, appending a non-zero triple repeat textual indicator to the first pass output string;

upon measuring a sequence of n non-repeating non-zero triples, dividing the non-repeating non-zero triples into groups of 1, 2 or 3 triples and appending a non-repeating non-zero textual indicator indicative of a combination of the groups of 1, 2 or 3 triples to the first pass output string; and executing a second pass of the triline, wherein the second pass includes:

providing an empty second pass output string, wherein a fully processed first pass output string serves as an input to the second pass output string;

upon encountering at least one component of the non-repeating non-zero textual indicator, checking for the at least one component of the non-repeating non-zero textual indicator in the codebook;

upon determining the at least one component of the non-repeating non-zero textual indicator is in the codebook at write location I, appending a codebook reference indicator to the second pass output string, wherein the codebook reference indicator indicates the inclusion of the at least one component of the non-repeating non-zero textual indicator at the write location I;

upon determining the at least one component of the non-repeating non-zero textual indicator is not in the codebook, adding the at least one component of the non-repeating non-zero textual indicator to the codebook at the write location I, incrementing the write location I by 1 and appending the at least one component of the non-repeating non-zero from the first pass output string to the second pass output string; and upon encountering a zero repeat textual indicator or a non-zero repeat textual indicator, appending the encountered zero repeat textual indicator or the non-zero repeat textual indicator unchanged to the second pass output string.

17. The method of claim 12, wherein each of the set of decoders is configured to decode one or more signals received from a corresponding encoder of the set of encoders by constructing a codebook in the same sequence utilized by the corresponding encoder.

18. The method of claim 12, wherein the electron beam lithography system comprises:
a maskless electron beam lithography system.

19. The method of claim 18, wherein the maskless electron beam lithography system comprises:
a maskless reflective electron beam lithography system.

20. The method of claim 12, wherein the set of data pathways comprise:
a set of fiber optic communication links.

21. A system for compressed data transmission in an electron beam lithography system comprising:

an image source configured to store one or more gray-tone images suitable for printing at least a portion of a pattern onto a substrate by operation of an electron beam lithography system; and a data compression system including:

one or more triline aggregators configured to: receive a gray-tone image from the image source; and aggregate sets of lines of each of a set of regions of the gray-tone image into trilines, each region of the gray-tone image corresponding with one of a set of segments of a digital pattern generator of the electron beam lithography system; and encoding circuitry executing an encoding process based on acquired gray-tone values of each of the set of trilines, the encoding circuitry including one or more encoders configured to: sequentially encode each of a set of trilines of each of the set of regions of the gray-tone image, the one or more encoders equipped with a codebook configured to store a plurality of triline fragments and a write location; and transmit the encoded trilines of the set of regions of the gray-tone image to a decoding circuit, the decoding circuit having one or more set of decoders of the digital pattern generator, wherein the encoded trilines are transmitted via a set of data pathways, each of the set of decoders corresponding with one of the set of segments of the digital pattern generator, and wherein the encoded trilines of a region are transmitted to a decoder of a segment corresponding with the region.

22. The method of claim 21, wherein the encoding process further comprises:
executing a first pass of a triline; and
executing a second pass of the triline, wherein a fully processed first pass output string serves as an input to the second pass.

23. The method of claim 21, wherein the encoding process further comprises:

executing a first pass of a triline, wherein the first pass includes:

providing an empty first pass output string;

measuring each value of a triline from beginning of the triline to the end of the triline;

upon measuring a sequence of n repeats of 0, appending a zero repeat textual indicator to the first pass output string;

upon measuring a sequence of a non-zero triple T, appending a non-zero triple repeat textual indicator to the first pass output string;

upon measuring a sequence of n non-repeating non-zero triples, dividing the non-repeating non-zero triples into groups of 1, 2 or 3 triples and appending a non-repeating non-zero textual indicator indicative of a combination of the groups of 1, 2 or 3 triples to the first pass output string; and executing a second pass of the triline, wherein the second pass includes:

providing an empty second pass output string, wherein a fully processed first pass output string serves as an input to the second pass output string;

upon encountering at least one component of the non-repeating non-zero textual indicator, checking for the at least one component of the non-repeating non-zero textual indicator in the codebook;

upon determining the at least one component of the non-repeating non-zero textual indicator is in the codebook at write location I, appending a codebook reference indicator to the second pass output string, wherein the codebook reference indicator indicates the inclusion of the at least one component of the non-repeating non-zero textual indicator at the write location I;

upon determining the at least one component of the non-repeating non-zero textual indicator is not in the codebook, adding the at least one component of the non-repeating non-zero textual indicator to the codebook at the write location I, incrementing the write location I by 1 and appending the at least one component of the non-repeating non-zero from the first pass output string to the second pass output string; and upon encountering a zero repeat textual indicator or a non-zero repeat textual indicator, appending the encountered zero repeat textual indicator or the non-zero repeat textual indicator unchanged to the second pass output string.

24. The method of claim 21, wherein the transmitting the encoded trilines of the set of regions of the gray-tone image to a set of decoders of the digital pattern generator comprises:
    transmitting each of the encoded trilines of a first region of the set of regions of the gray-tone image to a first decoder of a first segment of the digital pattern generator; and
    transmitting each of the encoded trilines of at least a second region of the set of regions of the gray-tone image to at least a second decoder of at least a second segment of the digital pattern generator.

25. The method of claim 21, wherein the one or more encoders comprise:
    a set of encoders, wherein each of the set of encoders is configured to transmit a set of sequentially encoded trilines to one of the set of decoders of the digital pattern generator of the electron beam lithography system.

26. The method of claim 21, wherein the set of data pathways comprise:
    a set of fiber optic communication links.

27. The method of claim 21, wherein the electron beam lithography system comprises:
    a maskless electron beam lithography system.

28. The method of claim 27, wherein the maskless electron beam lithography system comprises:
    a maskless reflective electron beam lithography system.

29. The method of claim 27, wherein the substrate comprises:
    a semiconductor wafer.

30. A system for electron beam lithography with data compression and transmission capabilities comprising:
    an electron beam lithography optical sub-system including:
        an electron source;
        a set of illumination optics;
        a digital pattern generator;
        a set of projection optics configured to project electrons reflected from the digital pattern generator onto one or more portions of one or more substrates disposed on a substrate stage;
        an image source configured to store one or more gray-tone images suitable for printing at least a portion of a pattern onto a substrate by operation of the electron beam lithography optical sub-system; and
    a data compression system including:
        one or more triline aggregators configured to receive a gray-tone image from the image source; and aggregate sets of lines of each of a set of regions of the gray-tone image into trilines, each region of the gray-tone image corresponding with one of a set of segments of the digital pattern generator of the electron beam optical sub-system system; and
        encoding circuitry executing an encoding process based on acquired gray-tone values of each of the set of trilines, the encoding circuitry including one or more encoders configured to sequentially encode each of a set of trilines of each of the set of regions of the gray-tone image, the one or more encoders equipped with a codebook configured to store a plurality of triline fragments and a write location; and transmit the encoded trilines of the set of regions of the gray-tone image to a decoding circuitry, the decoding circuitry including one or more decompression system, the one or more decompression system having a set of decoders of the digital pattern generator, wherein the encoded trilines are transmitted via a set of data pathways, each of the set of decoders corresponding with one of the set of segments of the digital pattern generator, wherein the encoded trilines of a region are transmitted to a decoder of a segment corresponding with the region.

31. The method of claim 30, wherein the electron beam lithography system comprises:
    a maskless electron beam lithography system.

32. The method of claim 31, wherein the maskless electron beam lithography system comprises:
    a maskless reflective electron beam lithography system.

33. The method of claim 30, wherein the substrate comprises:
    a semiconductor wafer.

34. The method of claim 1, wherein the encoding process further comprises executing at least one pass of a triline and appending at least one textual indicator to the triline.

* * * * *